United States Patent [19]
Saneinejad et al.

[11] Patent Number: 5,754,401
[45] Date of Patent: May 19, 1998

[54] PRESSURE COMPLIANTLY PROTECTED HEATSINK FOR AN ELECTRONIC DEVICE

[75] Inventors: Mohsen Saneinejad, Sunnyvale; David K. J. Kim; Mark H. Waters, both of San Jose, all of Calif.

[73] Assignee: Sun Microsystems, Inc., Palo Alto, Calif.

[21] Appl. No.: 602,953

[22] Filed: Feb. 16, 1996

[51] Int. Cl.$^6$ .................................................. H05K 7/20
[52] U.S. Cl. ...................... 361/705; 29/832; 257/727; 361/719
[58] Field of Search ......................... 29/592.1, 827, 29/832, 840, 842; 165/80.3, 185; 174/16.3, 252; 257/712, 713, 718, 719, 726, 727; 361/690, 694, 695, 704, 705, 713, 717–719

[56] References Cited

U.S. PATENT DOCUMENTS

| | | | |
|---|---|---|---|
| Re. 31,114 | 12/1982 | Berg | 339/170 F |
| 3,864,607 | 2/1975 | Phillips | 361/710 |
| 4,639,829 | 1/1987 | Ostergren | 361/704 |
| 4,748,495 | 5/1988 | Kocharek | 357/82 |
| 4,812,949 | 3/1989 | Fontan | 361/386 |
| 5,019,940 | 5/1991 | Clemens | 361/386 |
| 5,155,661 | 10/1992 | Nagesh | 361/386 |
| 5,276,961 | 1/1994 | Matta | 29/827 |
| 5,280,411 | 1/1994 | Dirks | 361/707 |
| 5,305,185 | 4/1994 | Samarov | 361/704 |
| 5,313,099 | 5/1994 | Tata et al. | 257/717 |
| 5,384,940 | 1/1995 | Soule | 361/719 |
| 5,533,256 | 7/1996 | Call | 29/840 |
| 5,590,026 | 12/1996 | Warren | 361/704 |

*Primary Examiner*—Gerald P. Tolin
*Attorney, Agent, or Firm*—Flehr Hohbach Test Albritton & Herbert LLP

[57] ABSTRACT

A heatsink is pressure compliantly mounted against a substrate-mounted packaged electronic device such that the heatsink is not readily dislodged from the device package. A layer of pressure-compliant elastomeric foam material is sandwiched between the upper surface of the heatsink and an overlying shroud, which biases the heatsink downward toward the packaged device, which may be a BGA-packaged device. The lower heatsink surface is attached to the upper device package surface with double-sided thermal tape, and the shroud is attached to the substrate and compressively but compliantly urges each heatsink into more intimate thermal contact with an underlying device. The pressure-compliant material compensates for dimensional vertical tolerances associated with the substrate-mounted devices and heatsinks, while dampening vibrations and minimizing stress and torque that could otherwise damage the devices and/or the integrity of their electrical connections to the substrate.

17 Claims, 5 Drawing Sheets

5,754,401

PRESSURE COMPLIANTLY PROTECTED HEATSINK FOR AN ELECTRONIC DEVICE

FIELD OF THE INVENTION

This invention relates to dissipating heat generated by solid state devices including ball grid array ("BGA") packaged devices, and more specifically to providing heat sinks that do not readily become detached from such devices, and that do not physically stress the devices.

BACKGROUND OF THE INVENTION

Integrated circuits ("ICs") are fabricated on a semiconductor substrate that is mounted within a typically epoxy or ceramic overmold package for later mounting on a printed wiring board ("PWB"). The ICs generally will include various semiconductor devices such as bipolar or metal-on-semiconductor ("MOS") transistors, as well as effective resistor and capacitor components.

As fabrication techniques improve, devices and components are made smaller, more complex circuits can be implemented, and a greater number of input and output leads ("pinouts") must be made available. Further, because a greater number of transistor devices can be fabricated on an IC die of a given size, adequately dissipating the heat generated by the IC becomes more difficult.

One packaging system for providing an IC with a large number of pinouts in a relatively small package area is known as the ball grid array ("BGA") package, such as packages 10-1, 10-2 shown in FIG. 1. An IC die 20-1, 20-2 (shown in phantom) is contained internally within respective packages 10-1, 10-2. Various connections (e.g., for input/output signals, test nodes, power and ground supply leads) are made within each package. The connections couple various IC nodes to pads within the package, and to meltable solder balls 30 on the lower surface 40 of the package. The lower surface of each package commonly includes a grid-like array of solder balls 30, spaced-apart 1 mm or so, arranged in rows and columns.

The packages are placed on a substrate, for example a printed wiring board ("PWB") or printed circuit board ("PCB") 50. The substrate upper surface contains a grid-like array of conductive pads 60 that are coupled by traces to circuit and power connector pins on the substrate. Solder balls 30 are aligned with pads 60, and a heat process melts the solder balls to the pads. The result is to electrically (and mechanically) couple package 10 to pads 60 and substrate 50.

Although FIG. 1 depicts solder balls 30 spaced-apart vertically from pads 60, once package 10 is attached to substrate 50, the vertical separation between lower surface 40 of the package and the upper surface of the substrate will only be about 0.013 inch (0.3 mm).

In this manner, the IC within the package can receive operating voltage, input signals, and other signals that may be coupled to the substrate from external circuitry through a connector. Typically the substrate includes connector pins that plug into a connector on a backplane, that supplies operating voltages and other signals. Although the BGA configuration of FIG. 1 has the advantage of being inexpensive to fabricate, it does not do a good job of dissipating IC-generated heat. To prevent IC overheating, a fan and/or heat sink may be required to help dissipate heat.

U.S. Pat. No. 5,313,099 to Tata discloses a heatsink similar to assembly 65, shown in the left-hand portion of FIG. 1, herein for use with a BGA package, e.g., package 10-1. Using the reference numerals shown in FIG. 1 herein, Tata's includes an adapter 70 that is attached to package 10-1, after which a finned heatsink 80-1 is screwed into a threaded opening 90 in the adaptor. The lower surface of the heatsink makes thermal contact with the upper surface 100 of package 10-1, and helps dissipate heat generated by IC 20-1. The heatsink assembly should be removable to permit access to upper surface 100 of package 10-1, for example to examine a date-code on the package surface should device 20-1 be defective.

Unfortunately, Tata's heatsink 80-1 can all too easily be torn-off adapter 70 and/or package 10-1 during mounting of components on substrate 50, and during subsequent handling of the substrate, especially in the presence of mechanical vibration.

Further, Tata's assembly can induce bending stress in package 10-1 resulting in intermittencies within the packaged IC 20-1, and in the interface between solder balls 30 and pads 60. Understandably, such stresses are detrimental to reliable operation of IC 20-1. Sufficient mechanical stress can even bow the substrate to the extent that edge electrical connections to backplane connectors may be impaired. Mechanical vibration of heatsink 80-1 can create torsional forces that also tend to stress the solder ball-pad interfaces. Fabricating the threaded heatsink and the adaptor can be expensive, and attaching the adaptor and then threading on the heatsink is time consuming, and thus contributes to overall manufacturing cost. Thus, while Tata's system can provide adequate heatsinking, the system also presents many drawbacks.

The right-hand portion of FIG. 1 depicts an alternative prior art system 105 for attaching a heatsink (here, 80-2) to a device package (here, 10-2) to be cooled. A layer of double-sided adhesive thermal tape 200 is between the upper surface of package 10-2, and the lower surface of a heatsink 80-2. The adhesive holds heatsink 80-2 to package 10-2 with relatively minimal thermal loss through the tape. While this technique avoids some of the shortcomings of the Tata system, heatsink 80-2 can readily be dislodged from package 10-2. For example, at temperatures exceeding about 105° C., the adhesive on tape 200 becomes less sticky. This undesirably permits the heatsink to separate from the device package, especially if there is vibration, or if the unit is operated at high altitude, e.g., 2 km or so. The resultant degraded heat dissipation can cause damage or destruction to IC 20-2 within package 10-2.

In summary, there is a need for method and apparatus for effectively and reliably dissipating heat from a BGA package without inducing mechanical stress in the BGA package, or in the bonds between solder balls and board pads. Such an apparatus should be relatively inexpensive to fabricate and employ, and should not readily transmit mechanical vibration through the heatsink to the BGA package. Further, reliable coupling between the package and the cooling apparatus should be ensured, even at elevated temperature and altitude and mechanical vibration.

The present invention discloses such a method and apparatus for dissipating heat from a BGA package.

SUMMARY OF THE PRESENT INVENTION

The present invention prevents a heatsink from dislodging from an underlying device package by sandwiching the heatsink between the upper surface of the device package and the lower surface of an overlying shroud. Preferably a layer of elastomeric material is sandwiched between the lower surface of the shroud and the upper surface of the heatsink, to compliantly bias the heatsink toward the package to be cooled. The lower surface of the heatsink is attached to the upper surface of the device package with double-sided adhesive thermal tape. The lower surface of the device package, which may be a BGA-packaged device, is soldered to conductive pads on a substrate.

The shroud has a higher modulus of elasticity than the substrate and is substantially rigidly attached to the substrate, and/or is rigidly attached to at least one heatsink that has no overlayer of elastomeric material.

In a typical application in which many device packages have heatsinks, the elastomeric material can provide compensation for height variations of the substrate-mounted device package and heatsink. To compensate for aging of the elastomeric material and to protect against excessive pressure, the upper surface of the heatsinks preferably define a groove. A portion of the elastomeric material is compressed into the groove by the downward pressure exerted by the shroud.

The force exerted by the heatsink against the device is primarily compressive with minimal torsional components. As a result, the heatsinks are compliantly but securely held against the device packages, and are not readily dislodged. Further, the heatsinks are to held without inducing mechanical stress in the package, in the IC within, or at the package-substrate interface, even at elevated temperature, high altitude, and in the presence of mechanical vibration.

Other features and advantages of the invention will appear from the following description in which the preferred embodiments have been set forth in detail, in conjunction with the accompanying drawings.

DETAILED DESCRIPTION OF THE PREFERRED EMBODIMENT

Figure 1:
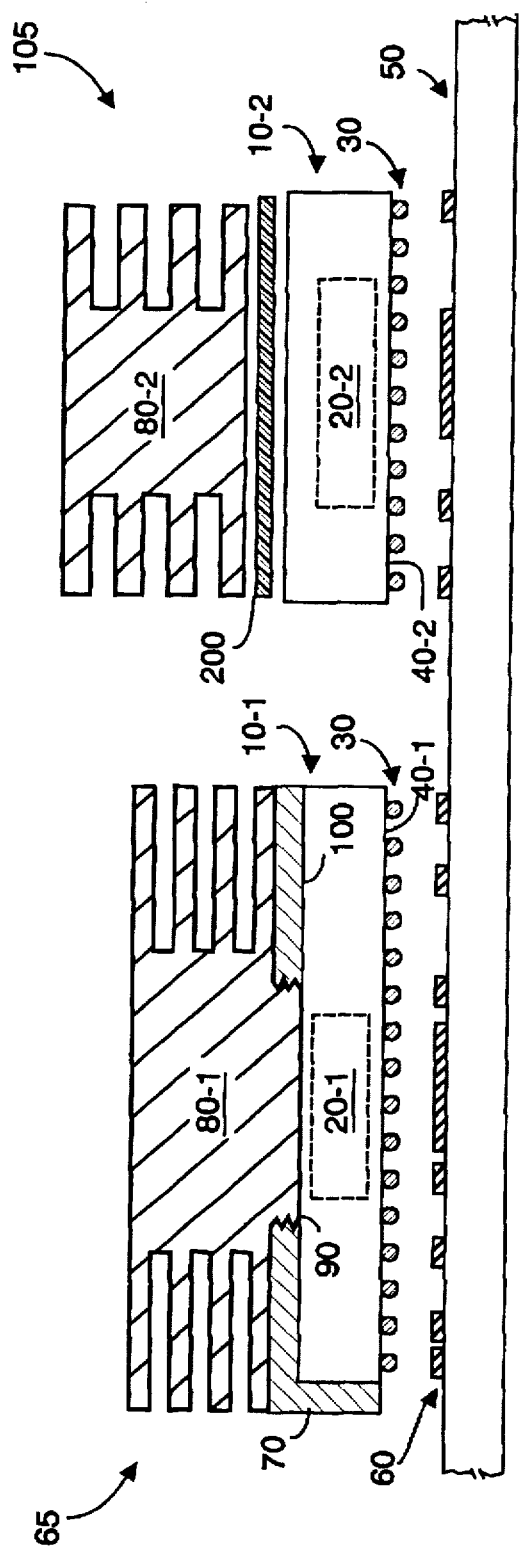
FIG. 1 depicts a heatsink assembly used with a BGA packaged device, according to the prior art.
Figure 2:
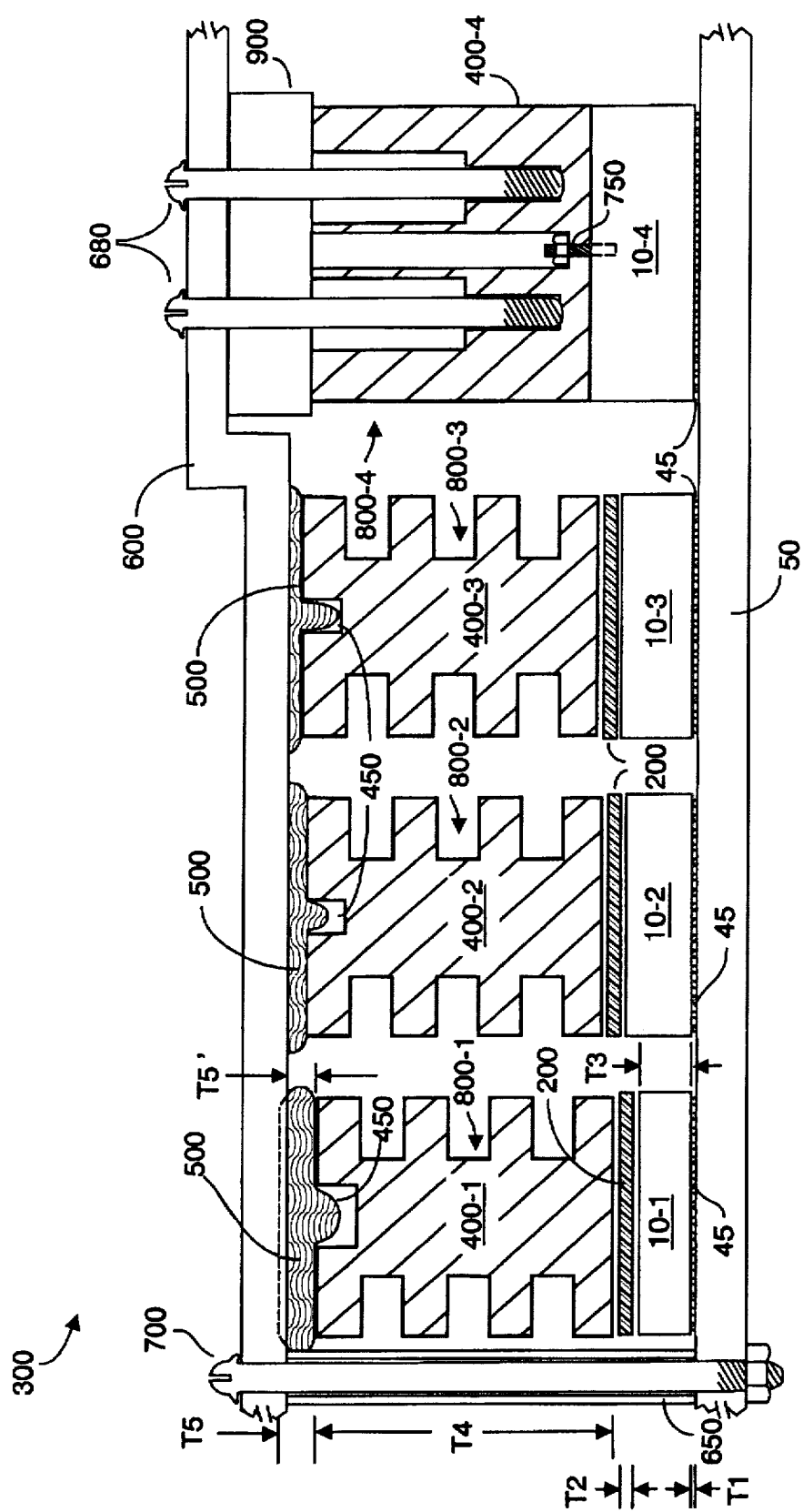
FIG. 2 depicts a heatsink assembly used with BGA packaged devices, according to a preferred embodiment of the present invention.

FIG. 2 depicts a system 300 in which various electronic packages 10-1, 10-2, . . . 10-N are attached to conductive pads, shown generally as 45, on the upper surface of a substrate 50, e.g., a printed circuit board or printed wiring board. It is understood that each package includes an electronic device or integrated circuit, and that some or all of the packages 10-N may be BGA packages. For a BGA package, the distance T1 separating the upper substrate surface from the lower package surface will be perhaps 0.013 inch (0.3 mm) with a tolerance of about ±0.08 mm.

The vertical dimension T3 of the device packages can vary with the package type, but may also vary even with identical packages due to fabrication tolerances. Thus, while packages 10-2 and 10-3 may be of similar package types, or even nominally identical, one package (here 10-3) may in fact have a greater vertical dimension T3 due to fabrication tolerances. In practice, for BGA packages, T3 may range from about 1.4 mm to about 1.6 mm, and may exhibit a dimensional tolerance of about ±0.1 mm.

Some or all of the devices may require a heatsink, e.g., 400-N, and/or a cooling fan 900, to promote better heat dissipation. The upper surface of each device package requiring a heatsink is covered with a piece of double-side thermal adhesive tape 200 that secures the lower surface of the heatsink to the upper surface of the device package. Preferable the shape and area of each piece of thermal tape 200 substantially coincide with the shape and area of the underlying device package 10-N. Tape 200 has a nominal thickness T2 of about 3 mm in the preferred embodiment. Thermally conductive paste or the like may also be used to promote good heat transfer through tape 200. Tape 200 may be purchased commercially from Chomerics, Inc. located at Woburn, Mass., from Aavid, Inc. located at Lanconia, N.H., among other manufactures.

According to the present invention, a heatsink 400-N is adhesively attached (by the upper surface of tape 200, to each package 10-N requiring better heat dissipation that would otherwise occur. Thus, in FIG. 2 a heat sink 400-1 is attached atop package 10-1, heat sinks 400-2 and 400-3 are attached atop packages 10-2, 10-3 respectively, and a heat sink 400-4 is attached atop package 10-4. In the embodiment shown, device package 400-4 is assumed to dissipate substantial heat such that the presence of a fan 900 is required to ensure adequate heat dissipation.

In some applications, the various required heat sinks may be identical, e.g., such as heatsinks 400-2 and 400-3, or there may be several different configurations and/or size heatsinks, depending upon how much heat must be dissipated from or at each package 10-N. For example, heatsink 400-4 is shown both larger and having a different finned configuration than the other heatsinks, perhaps because the device within package 10-4 must dissipate more heat than the other devices.

Each heatsink has a vertical height T4 that may differ from heatsink to heatsink, because the heatsinks may have been purposely manufactured with different heights and/or due to manufacturing tolerances. In a preferred embodiment, a typical dimension T4 for a heatsink was in the range of about 25 mm to 35 mm with a tolerance of perhaps ±0.2 mm or so. In the same embodiment, the heatsinks had a cross-sectional transverse dimension (e.g., left-to-right in FIG. 2) of perhaps 22 mm. Heatsinks such as shown in FIG. 2 may be fabricated by extruding a metal such as 6063T5/T6 grade aluminum, although other fabrication techniques and heatsink configurations may instead be used.

Collectively, each mounted device 10-N, its associated overlying piece of tape 200, and its overlying heatsink 400-N will be referred to herein as a "stack" 800-N. Thus, in FIG. 2, the overall vertical height from the substrate upper surface to the upper surface of heatsinks 400-1, 400-2, 400-3, e.g., to the upper surface of stacks 800-1, 800-2, 800-3 is approximately similar. By contrast, in FIG. 2 the upper surface of heatsink 400-4 (e.g., of stack 800-4) is intentionally shown as having a dissimilar dimension, and the vertical height of fan 900 is contributes to dimension T4 for heatsink 400-4.

As will be described shortly, each heatsink preferably includes a notch or recess 450 at its upper surface if the heatsink is to be covered with a piece of elastomeric foam-like material 500. The present invention sandwiches a piece of compliant elastomeric foam-like material 500 between the upper surface of each such heatsink and the lower surface of an overlying shroud 600. A separate piece of material 500 may be provided for each heatsink (as shown in FIGS. 2 and 3), or more preferably a common, larger, piece of foam material 500 is provided for several or all heatsinks (as shown in FIGS. 4 and 5).

The compliant foam-like material 500 is adhesively attached to the underside of shroud 600 such that when the shroud is mounted, heat-sinked devices have the upper surface of their heatsink in compressive contact with the lower surface of the foam-like material.

In the embodiment of FIG. 2, preferably each piece of material 500 is sized at least as large as the upper surface of an underlying heatsink. The embodiment of FIG. 2 provides an option of using different thickness foam material 500, if desired, over stacks of known differing heights. For example, material 500 for stack 800-1 could intentionally have a greater uncompressed thickness than material 500 for stack 800-3, whose packaged device 10-3 has a known higher profile.

Figure 3:
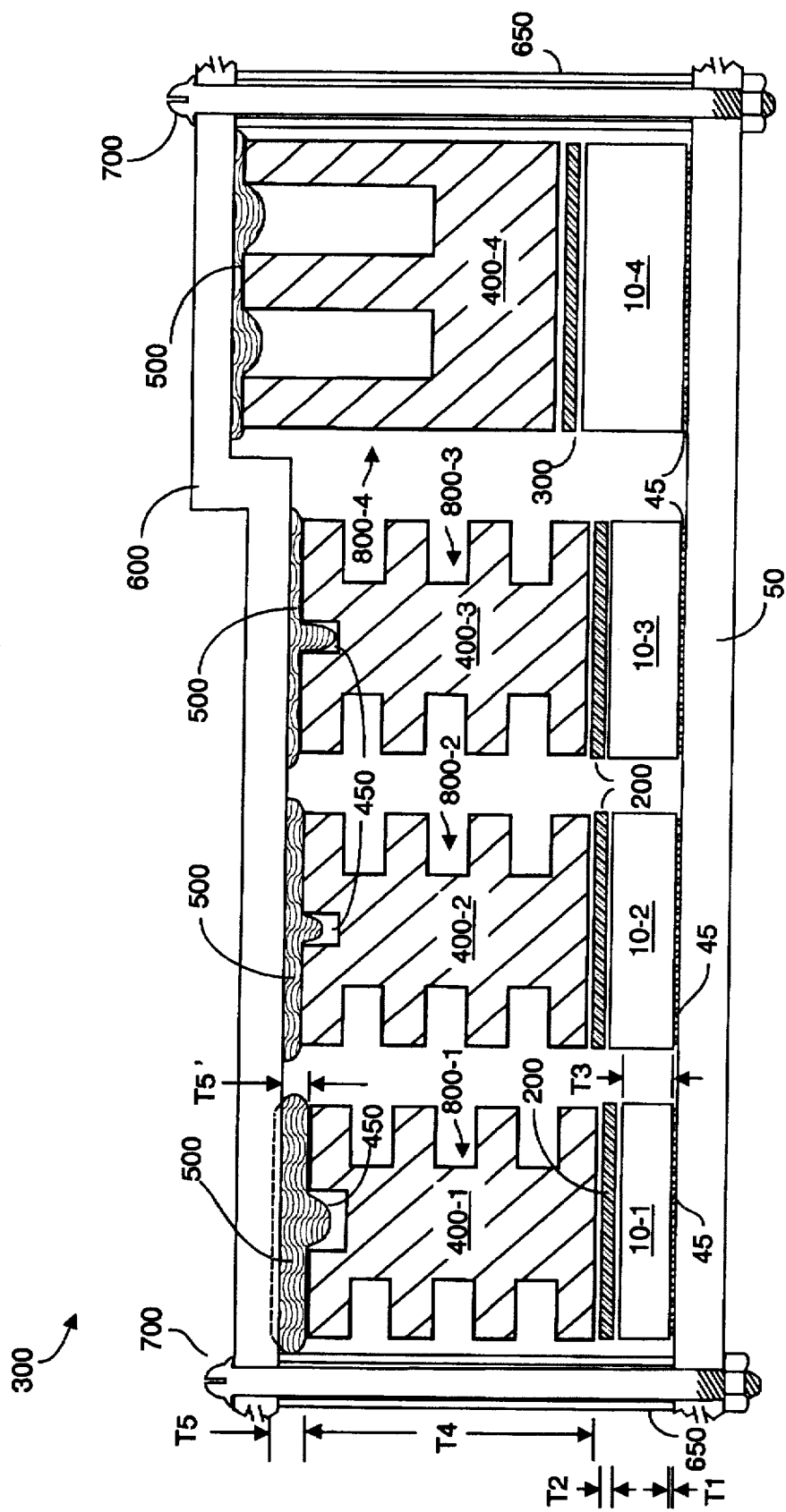
FIG. 3 depicts a second preferred embodiment of a heatsink assembly used with BGA packaged devices, according to the present invention.
Figure 4:
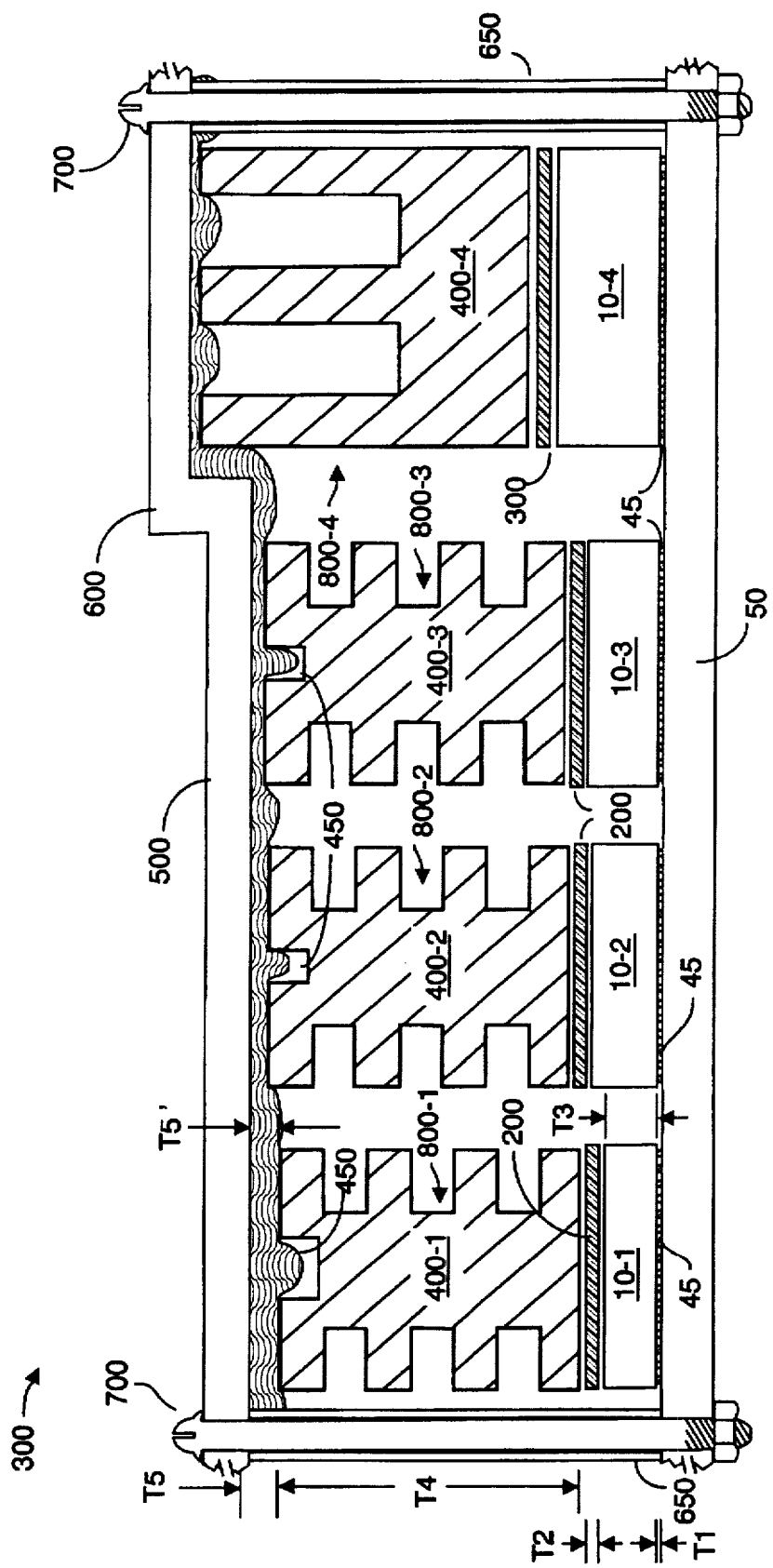
FIG. 4 depicts a third preferred embodiment of a heatsink assembly used with BGA packaged devices, according to the present invention.
Figure 5:
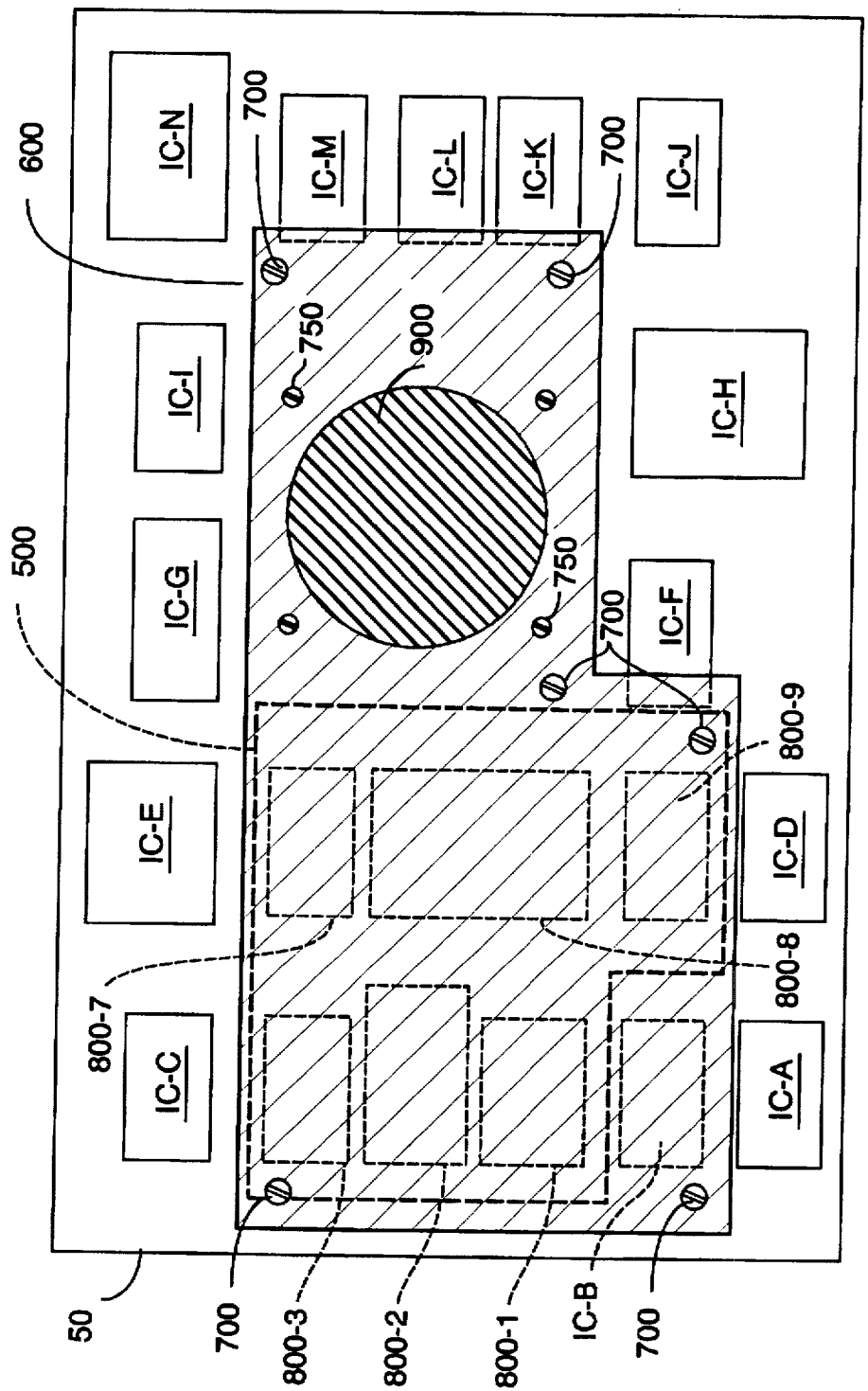
FIG. 5 is a plan view of a heatsink assembly used with packaged electronic devices, according to the present invention.

For the embodiments shown in FIGS. 2, 3 and 4, when uncompressed, material 500 will have a vertical dimension T5' of perhaps 2.8 mm with a tolerance of perhaps ±0.5 mm. In the preferred embodiment, material 500 was so-called PORON material, obtained from Rogers, Inc. located at E. Woodstock, Conn., their part number 4716. It will be appreciated that disposing material 500 between the shroud lower surface and the upper surface of the heatsinks avoids the disruption to an efficient thermal interface that would result if, for example, material 500 were disposed between the lower surface of the heatsinks and the upper surface of the devices to be cooled.

Shroud 600 is disposed over the various heatsinks and foam material, and is substantially rigidly attached to substrate 50 by one or more rigid collars 650 and screw assemblies 700, or the like. In the embodiment shown in FIG. 2, screws 680 retain shroud 600, fan 900, and heatsink 400-4, and screw into threads in the lower portion of the heatsink. Heatsink 400-4, in turn, is anchored to device package 10-4 by studs 750 that project upwardly from the package 10-4. Studs 750 may typically be metric size M5 and are partially embedded in package 10-4 during formation of the package. The formation of such device packages with projecting studs is known in the art, and is may be done on a custom order basis by the device manufacturer.

Alternatively, as shown in FIG. 3, screw assemblies could be secured at all locations into the substrate 50. By "substantially rigidly attached" it is meant that there is essentially no lateral displacement of the shroud. If, for example, one were to hold assembly 300 in hand and try to move the shroud laterally with respect to the underlying substrate, no such movement would occur. (Of course at a microscopic level, a minute amount of such movement might in fact be present.) Collars 650 may be metal tubes, or may be fabricated integrally with shroud 600.

In the embodiment of FIG. 2, the vertical dimensions associated with stack 800-4 are such that it is ensured that the stack height (through and including the upper surface of fan 900) will contact the lower surface of shroud 600. By this it is meant that no other stack in system 300 can be taller than stack 800-4, despite worse case variations in height tolerances. Because the resultant mechanical interface between shroud and the upper surface of fan 900 is guaranteed, no elastomeric material is used between the shroud and stack 800-4. In this fashion, a suitably rigid attachment of shroud 600 to substrate 50 is achieved at the right-side of system 300. (Collar 650 and associated screw mounting provide a suitably rigid attachment at the left-side of system 300.)

By contrast, in the configuration of FIG. 3, no fan is used, and the upper surface of heatsink 400-4 is covered with a piece of elastomeric material 500 (portions of which may be received into the recesses present between the vertical fins of heatsink 400-4. In this configuration, rigid attachment at the right-hand side of the system is achieved using a collar 650 and associated screw assembly 700.

Shroud 600 preferably is fabricated from a plastic material that is relatively more flexible than substrate 50, to ensure that any flexing or bowing occurs in the shroud and not in the substrate. In the preferred embodiment, the shroud was fabricated from a polycarbonate type plastic having a modulus of elasticity of about 390,000 pounds/in$^2$ and had a nominal thickness of about 3 mm, with outside dimensions of approximately 109 mm×77 mm. Those skilled in the art will appreciate that shroud 600 may include stiffening members to provide a desired amount of stiffness.

In the embodiment shown in FIGS. 2–4, shroud 600 is fabricated with a non-planar lower surface. A shroud so fabricated can more readily accommodate one (or more) stacks having a substantially dissimilar height relative to other stacks. This aspect is more readily seen in FIG. 3, in which a planar shroud that accommodated the vertical height T4 of stack 800-4 would be too vertically spaced-apart from the remaining stacks. By contrast, shroud 500 in FIG. 5 has a planar lower surface.

The lower surface of shroud 600 exerts a downward bias force that compliantly presses the foam-like material 500 toward the upper surface of an underlying heatsink, where material 500 is present. Material 500 is subjected to an amount of downward pressure that is a function of the vertical dimension and tolerances of each stack, the vertical thickness and tolerance of material 500, the upper surface area of the heatsinks 400-N, the relative flexibility of the shroud material and the substrate 50 material, and the amount of compressive force exerted by screws 700. In the preferred embodiment, a compressive pressure of about 6 pounds/in$^2$ was used.

Preferably the upper surface of each heatsink overlaid with material 500 is designed to optimize the variation tolerance associated with the compressive pressure. As shown in FIGS. 2, 3 and 4, the upper surface of the heatsinks preferably include one or more notches 450 that serve to receive some of the foam material as it is compressed by shroud 600 and screws 700. As such, the notches advantageously can reduce the downwardly exerted pressure to a controlled amount during early life tolerance of other components, and also maximize pressure at the end of life as material 500 takes on a permanent pressure "set" in highly compressed areas.

In the preferred embodiment, notches 450 were about 2 mm deep and about 2 mm in transverse dimension, although other dimensions could of course be used. Note that notch (es) need not be explicitly formed in heatsink 400-4 as the space between vertical radiator fins provides notches automatically. While notched heatsinks are described, heatsinks without an explicit notch or notches in their upper surface may also be used.

Note from FIGS. 2–4 that foam-like material 500 is compressed substantially more against heatsink 400-3 than heatsink 400-2 or heatsink 400-1, because stacks 800-1 and 800-2 are shown as having less vertical height relative to substrate 50. The difference in stack heights, e.g., distance (T1+T2+T3+T4), from substrate surface to the upper surfaces of heatsinks 400-1, 400-2, 400-3 could be due to slightly differing components and/or fabrication tolerances. In any event, foam material 500 automatically compensates for these dimensional changes, and compressed dimension T5' for the foam atop heatsink 400-3 will be less than for the foam atop heatsink 400-2, which in turn is less than dimension T5' for the foam atop heatsink 400-1.

FIG. 5 is a plan view showing a substrate 50 upon which are mounted a variety of packed electronic devices, some of which are heatsinked according to the present invention. For example, in FIG. 5, devices IC-A through IC-N are not heatsinked. By contrast, devices associated with stacks 800-1 through 800-8 are heatsinked according to the present invention. As such, it is understood that each of the stacks 800-N in FIG. 5 will include adhesive thermal tape (such as tape 200) between the upper surface of the heatsinked device package and the lower surface of a heatsink (such as heatsink 400-N). A shroud 600, which is planar in the embodiment of FIG. 5, and an attached piece of foam-like material 500 overlie at least the device packages to be heatsinked.

Note, for example, that a portion of shroud 600 may overlie device packages that do not require heatsinking, e.g., IC-B, a portion of IC-F, etc., and that the shroud may have whatever shape is desired or necessary. Thus, while shroud 600 is planar in FIG. 5, it need not be rectangularly shaped, or even have straight perimeter edges. In the configuration shown, the right-hand portion of the shroud defines a circular opening that surrounds the hub portion of a fan 900, which may be included to provide additional, active as opposed to passive, cooling. Note too that not all of the packaged devices to be cooled need not have a common configuration "footprint", and indeed it is not necessary that all of the devices, or indeed any, be BGA packaged devices.

The preferred embodiments shown meet Underwriters Laboratory ("UL") requirements. U.L. requirements dictate that T4>13 mm to adequately separate a "live component", e.g., device 10-N, and a potentially combustible foam-like material 500. Further, material 500 was sandwiched between a heatsink (a not "live" component) and the shroud (a "barrier"). Thus, there is minimal risk of fire propagation, and in practice the heatsink temperature would normally not exceed about 80° C.

Unlike prior art heatsink systems, the present invention prevents the heatsinks from being dislodged from the underlying device packages, even at temperatures of 105° C. or more, at altitudes of 2 km, and in the presence of mechanical vibration.

It will be appreciated from FIGS. 2–5 that the presence of compliant material 500 helps secure the underlying heatsinks to the packaged devices to be cooled, while compensating for dimensional variations in stack height. Further, the compliant material reduces mechanical vibrations that might otherwise be more directly transmitted to the heatsinks. This vibration dampening reduces the magnitude of torques that might otherwise tend to break electrical bonds between the substrate surface and the contacts on the underside of the various devices. Packaged devices, including BGA packaged devices, are reliably cooled without being subjected to bending stress, or to stress and torque that can degrade electrical connections between the packaged devices and the substrate.

Applicants analyzed and compared performance and manufacturing cost to provide heatsinking according to the present invention versus what is provided using U.S. Pat. No. 5,313,099 to Tata. On a mass production basis, the present invention can be implemented for about 25% of the cost incurred to implement a Tata system, while achieving equivalent or even superior heat dissipation. Further, the present invention secures and protects the heatsinks from dislodgment (and thus protects the packaged devices from thermal damage). This protection is provided in addition to compensating for varying mechanical height tolerances in the "stacks", dampens vibrations, and reduces transmission of torque and stress to the underlying substrate.

Modifications and variations may be made to the disclosed embodiments without departing from the subject and spirit of the invention as defined by the following claims.

What is claimed is:

1. A method of heatsinking an electronic device mounted in a device package attached to a substrate, the method comprising the following steps:

(a) disposing a substantially non-compressible heatsink adjacent said package such that a lower surface of said heatsink is in thermal contact with at least a substantial portion of an upper surface of said package, said heatsink including an upper surface that defines a recess; and (b) disposing a piece of elastomeric material adjacent said upper surface of said heatsink such that a lower surface of said elastomeric material contacts said upper surface of said heatsink; and exerting a downward force against an upper surface of said elastomeric material such that a bottommost portion of said elastomeric material overlying said recess is compressively urged deeper into said recess, said recess being sized to receive a portion of said elastomeric material;

wherein said upper surface of said heatsink is compliantly biased downward toward said package.

2. The method of claim 1, wherein step (a) includes attaching said lower surface of said heatsink to said upper surface of said package using a piece of double-sided adhesive thermal tape.

3. The method of claim 1, wherein said elastomeric material includes foam.

4. The method of claim 1, wherein step (b) further includes:

disposing a shroud member, sized to at least overlie said elastomeric material, such that a lower surface of said shroud member is pressed against said upper surface of said elastomeric material; and applying a downward compressive force against an upper surface of said shroud member.

5. The method of claim 4, wherein:

said shroud member has a modulus of elasticity greater than a modulus of elasticity of said substrate; and said shroud member is substantially rigidly mounted to said substrate.

6. The method of claim 1, wherein said electronic device is mounted in a ball grid array (BGA) package.

7. The method of claim 1, wherein said substrate includes a printed wiring board.

8. A method of heatsinking a first electronic device mounted in a first device package attached to a substrate and heatsinking a second electronic device mounted in a second device package attached to said substrate, the method comprising the following steps:

(a) disposing a substantially non-compressible first heatsink adjacent said first package such that a lower surface of said first heatsink is in thermal contact with at least a substantial portion of an upper surface of said first package;

(b) disposing a second heatsink adjacent said second package such that a lower surface of said second heatsink is in thermal contact with an upper surface of said second package;

wherein at step (a) and step (b), said upper surface of at least one of said first heatsink and said second heat sink defines a recess;

(c) disposing an elastomeric material adjacent an upper surface of said first heatsink such that a lower surface of said material contacts said upper surface of said first heatsink;

(d) disposing an elastomeric material adjacent an upper surface of said second heatsink such that a lower surface of said material contacts said upper surface of said second heatsink; and (e) compliantly biasing an upper surface of said elastomeric material downward toward said first heatsink and downward toward said second heatsink such that a bottommost portion of said elastomeric material overlying said recess is compressively urged deeper into said recess, said recess being sized to receive a portion of said elastomeric material.

9. The method of claim 8, wherein at step (c) and step (d), said elastomeric material adjacent said surface of said first heatsink is a separate piece of elastomeric material from said elastomeric material adjacent said surface of said second heatsink.

10. The method of claim 8, wherein at least one of step (a) and step (b) includes attaching a lower surface of a said first heatsink to said upper surface of said first package using a first piece of double-sided adhesive thermal tape, and attaching a lower surface of a said second heatsink to said upper surface of said second package using a second piece of double-sided adhesive thermal tape.

11. The method of claim 8, wherein step (e) includes:

disposing a shroud member, sized to at least overlie said elastomeric material, such that a lower surface of said shroud member is pressed against said upper surface of said elastomeric material; and applying a downward compressive force against an upper surface of said shroud member.

12. The method of claim 8, wherein at step (e), said shroud member has a modulus of elasticity greater than a modulus of elasticity of said substrate; and said shroud member is substantially rigidly mounted to said substrate.

13. The method of claim 8, wherein at least one of said first device and said second device is a ball grid array (BGA) packaged device.

14. The method of claim 8, wherein said substrate includes a printed wiring board.

15. The method of claim 8, wherein at step (c) and step (c), said elastomeric material includes foam.

16. A system for heatsinking an electronic device mounted in a device package attached to a substrate, the system comprising:

a substantially non-compressible heatsink disposed adjacent said package such that a lower surface of said heatsink is in thermal contact with at least a substantial portion of an upper surface of said package, an upper surface of said heat sink defining a recess;

a piece of elastomeric material disposed adjacent an upper surface of said heatsink such that a lower surface of said material contacts said upper surface of said heatsink; and a shroud member, sized to at least overlie said piece of elastomeric material such that a lower surface of said shroud member is pressed against said upper surface of said elastomeric material, said shroud member having a modulus of elasticity greater than a modulus of elasticity of said substrate;

said shroud member being substantially rigidly mounted to said substrate so as to exert a downward force against an upper surface of said elastomeric material such that a bottommost portion of said elestomeric material overlying said recess is compressively urged into said recess.

17. The system of claim 16, wherein said electronic device is contained with a ball grid array (BGA) package, and wherein said substrate includes a printed wiring board.

* * * * *